United States Patent
Golko et al.

(10) Patent No.: US 9,288,928 B2
(45) Date of Patent: Mar. 15, 2016

(54) LOAD SHARING DEVICE AND I/O ARCHITECTURE AGAINST IMPARTED ABUSE LOADS

(71) Applicant: APPLE INC., Cupertino, CA (US)

(72) Inventors: Albert J. Golko, Saratoga, CA (US); Eric S. Jol, San Jose, CA (US); Charles B. Woodhull, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/318,346

(22) Filed: Jun. 27, 2014

(65) Prior Publication Data

US 2015/0001364 A1 Jan. 1, 2015

Related U.S. Application Data

(63) Continuation of application No. 13/833,224, filed on Mar. 15, 2013, now Pat. No. 8,804,354.

(60) Provisional application No. 61/699,774, filed on Sep. 11, 2012.

(51) Int. Cl.
*G06F 1/16* (2006.01)
*H05K 5/00* (2006.01)
(Continued)

(52) U.S. Cl.
CPC .............. *H05K 7/14* (2013.01); *H01R 13/516* (2013.01); *H01R 13/748* (2013.01); *H02G 15/007* (2013.01); *H04M 1/0274* (2013.01); *H05K 5/0217* (2013.01)

(58) Field of Classification Search
CPC .............. H01R 13/52–13/5221; G06F 1/1626
USPC ............ 248/220.22, 568, 634, 224.7, 225.21; 439/271, 272, 587, 588; 174/58; 361/679.4, 679.41, 679.43, 679.45, 361/679.55, 679.56, 679.3; 403/6–9, 23
See application file for complete search history.

(56) References Cited

U.S. PATENT DOCUMENTS 5,002,184 A 3/1991 Lloyd
6,052,279 A 4/2000 Friend et al.
(Continued)

FOREIGN PATENT DOCUMENTS

CN 201252244 Y 6/2009
CN 102437492 A 5/2012
(Continued)

OTHER PUBLICATIONS

Office Action for Taiwanese Patent Application No. 102130318, mailed Dec. 12, 2014, 6 pages.
(Continued)

*Primary Examiner* — Terrell McKinnon
*Assistant Examiner* — Michael McDuffie
(74) *Attorney, Agent, or Firm* — Kilpatrick Townsend & Stockton LLP

(57) ABSTRACT

A bracket configured to be interposed between the housing of a mobile electronic device and an electrical receptacle that is disposed in the mobile electronic device. The bracket includes a bracket body, an elongated opening through the bracket and a sheath surrounding portions of the bracket body. The bracket body includes an elongated protrusion extending in a front direction from the front face of the bracket body and a pair of fastener accommodations extending through the bracket body, each fastener accommodation disposed on opposite sides of the elongated protrusion. The sheath includes a first portion surrounding a portion of the bracket body elongated protrusion and a second portion including a pair of fastener openings.

15 Claims, 6 Drawing Sheets

(51) Int. Cl.
*H05K 7/00* (2006.01)
*H05K 7/14* (2006.01)
*H02G 15/007* (2006.01)
*H04M 1/02* (2006.01)
*H01R 13/516* (2006.01)
*H01R 13/74* (2006.01)
*H05K 5/02* (2006.01)

(56) References Cited

U.S. PATENT DOCUMENTS

| | | | |
|---|---|---|---|
| 6,089,910 A * | 7/2000 | Suzuki et al. | 439/559 |
| 6,178,096 B1 | 1/2001 | Flickinger et al. | |
| 6,229,695 B1 | 5/2001 | Moon | |
| 6,244,886 B1 | 6/2001 | Strang et al. | |
| 6,254,428 B1 * | 7/2001 | Murakami et al. | 439/556 |
| 6,361,357 B1 | 3/2002 | Stillwell et al. | |
| 6,388,877 B1 | 5/2002 | Canova et al. | |
| 6,625,013 B2 | 9/2003 | Minaguchi et al. | |
| 6,962,510 B1 | 11/2005 | Chen et al. | |
| 7,209,113 B2 | 4/2007 | Park | |
| 7,481,664 B1 * | 1/2009 | Knoll et al. | 439/359 |
| 7,652,892 B2 | 1/2010 | Shiu et al. | |
| 7,753,701 B2 | 7/2010 | Tsuji | |
| 7,758,369 B2 * | 7/2010 | Miller et al. | 439/352 |
| 7,933,123 B2 * | 4/2011 | Wang et al. | 361/679.56 |
| 8,204,561 B2 * | 6/2012 | Mongan et al. | 455/575.8 |
| 8,342,325 B2 * | 1/2013 | Rayner | 206/320 |
| 8,542,482 B2 * | 9/2013 | Hsiung | 361/679.3 |
| 8,804,353 B2 * | 8/2014 | Montevirgen et al. | 361/756 |
| 8,804,354 B2 | 8/2014 | Golko et al. | |
| 8,804,355 B2 | 8/2014 | Uttermann et al. | |
| 2003/0049964 A1 * | 3/2003 | Pogliani | 439/588 |
| 2004/0240162 A1 * | 12/2004 | Hsu et al. | 361/680 |
| 2004/0248467 A1 | 12/2004 | Herlitz et al. | |
| 2005/0032415 A1 | 2/2005 | Sakamoto | |
| 2005/0124218 A1 | 6/2005 | Chen et al. | |
| 2005/0202727 A1 | 9/2005 | Andre et al. | |
| 2007/0206365 A1 | 9/2007 | Shiu et al. | |
| 2007/0207680 A1 * | 9/2007 | Chen | H01R 12/7005 439/680 |
| 2008/0050935 A1 | 2/2008 | Tsuji | |
| 2009/0059492 A1 * | 3/2009 | Glover | 361/680 |
| 2009/0080153 A1 * | 3/2009 | Richardson et al. | 361/679.56 |
| 2009/0130875 A1 | 5/2009 | Guo | |
| 2009/0257189 A1 * | 10/2009 | Wang et al. | 361/679.56 |
| 2009/0257817 A1 * | 10/2009 | Chu | H04M 1/0208 403/62 |
| 2009/0269962 A1 | 10/2009 | Miller et al. | |
| 2010/0035476 A1 * | 2/2010 | Wu | H01R 13/745 439/638 |
| 2010/0178957 A1 * | 7/2010 | Chen | 455/565 |
| 2010/0323554 A1 | 12/2010 | Shiu | |
| 2010/0323562 A1 * | 12/2010 | Yash | 439/752 |
| 2011/0034063 A1 * | 2/2011 | Su | H01R 13/502 439/362 |
| 2011/0068665 A1 | 3/2011 | Cao | |
| 2011/0086544 A1 * | 4/2011 | Yoshioka et al. | 439/587 |
| 2012/0008292 A1 | 1/2012 | Nichols et al. | |
| 2012/0051025 A1 | 3/2012 | Jol et al. | |
| 2012/0064776 A1 * | 3/2012 | Zhu | H01R 13/512 439/660 |
| 2012/0171898 A1 * | 7/2012 | Wang | H01R 24/64 439/607.01 |
| 2012/0181317 A1 | 7/2012 | Evens | |
| 2013/0188312 A1 * | 7/2013 | Rayner | 361/679.55 |
| 2014/0014408 A1 | 1/2014 | Milheiro et al. | |
| 2014/0069712 A1 | 3/2014 | Montevirgen et al. | |
| 2014/0069713 A1 | 3/2014 | Golko et al. | |
| 2014/0069714 A1 | 3/2014 | Uttermann et al. | |
| 2014/0078671 A1 * | 3/2014 | Hong | 361/679.56 |
| 2014/0192481 A1 * | 7/2014 | Wojcik et al. | 361/679.55 |
| 2015/0008031 A1 | 1/2015 | Uttermann et al. | |

FOREIGN PATENT DOCUMENTS

| | | |
|---|---|---|
| GB | 2361114 A | 10/2001 |
| JP | 2007127206 A | 5/2007 |
| TW | 409977 U | 10/2000 |
| TW | M331786 U | 5/2008 |
| TW | M400721 U | 3/2011 |
| TW | M409691 U | 8/2011 |
| TW | M423394 U | 2/2012 |
| WO | 2011160138 A2 | 12/2011 |

OTHER PUBLICATIONS

Final Office Action for U.S. Appl. No. 14/318,345, mailed Feb. 12, 2015, 7 pages.
International Search Report and Written Opinion for International PCT Application No. PCT/US2013/056594, mailed Nov. 21, 2013, 10 pages.
International Search Report and Written Opinion for International PCT Application No. PCT/US2013/056591, mailed Nov. 21, 2013, 10 pages.
International Search Report and Written Opinion for International PCT Application No. PCT/US2013/056596, mailed Dec. 4, 2013, 14 pages.
Notice of Allowance for U.S. Appl. No. 13/833,061, mailed Apr. 1, 2014, 10 pages.
Notice of Allowance for U.S. Appl. No. 13/833,421, mailed Apr. 3, 2014, 15 pages.
Notice of Allowance for U.S. Appl. No. 13/833,224, mailed Apr. 10, 2014, 15 pages.
Office Action for Taiwanese Application No. 102130312, mailed Sep. 16, 2014, 9 pages.
Non-Final Office Action for U.S. Appl. No. 14/318,345, mailed Dec. 15, 2014, 10 pages.
Notice of Allowance for U.S. Appl. No. 14/318,345, mailed Apr. 27, 2015, 9 pages.
International Preliminary Report on Patentability for International PCT Application No. PCT/US2013/056591, mailed Mar. 26, 2015, 7 pages.

* cited by examiner

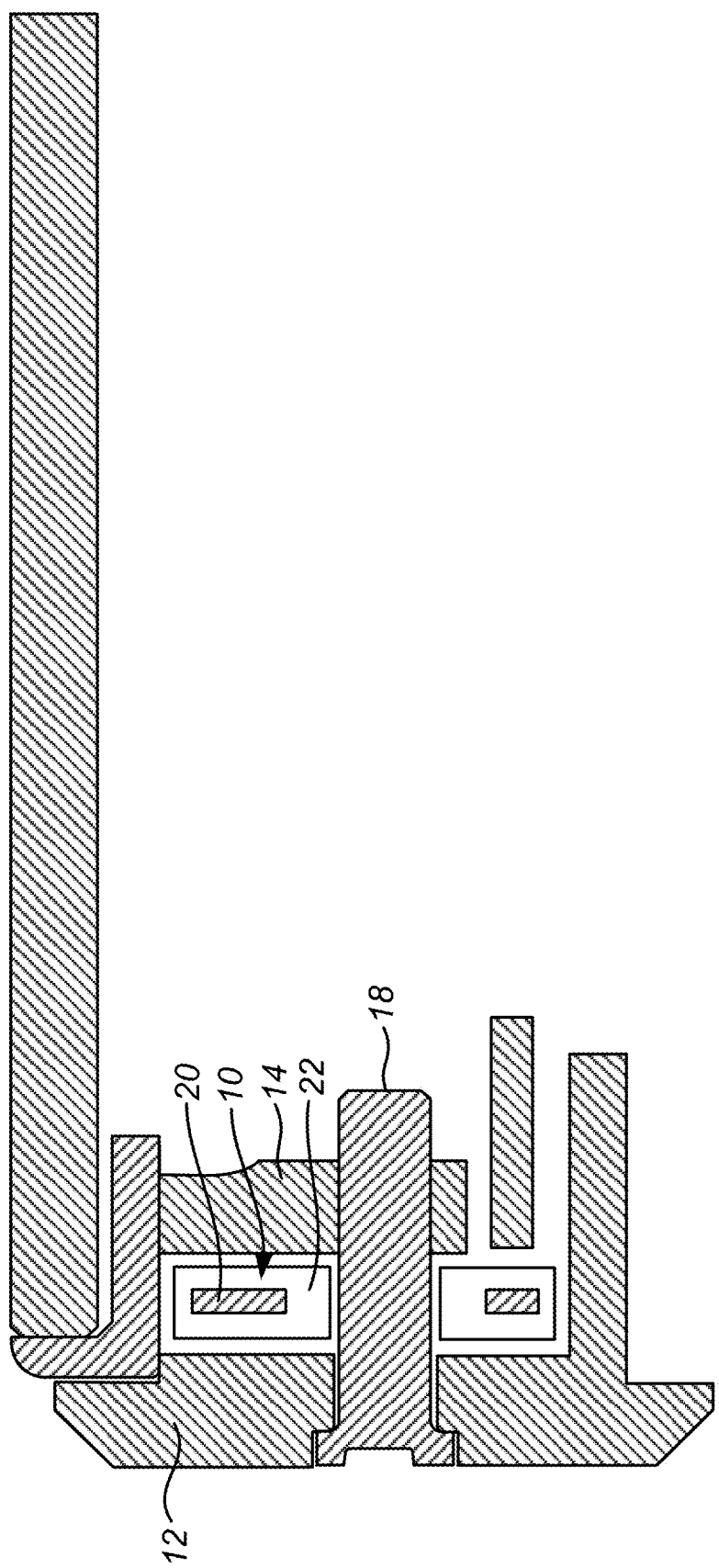

LOAD SHARING DEVICE AND I/O ARCHITECTURE AGAINST IMPARTED ABUSE LOADS

CROSS REFERENCE TO RELATED APPLICATIONS

This application is a continuation of U.S. application Ser. No. 13/833,244 filed Mar. 14, 2013, which claims benefit under 35 U.S.C. §119(e), of U.S. Patent Application No. 61/699,774 filed Sep. 11, 2012 for "Load Sharing Device and I/O Architecture Against Imparted Abuse Loads". The entire disclosure of the above mentioned applications are incorporated by reference for all purposes.

BACKGROUND OF THE INVENTION

Mobile devices typically require connectivity with cables or cords for power recharging, data connectivity and other purposes. The interface between such cables or cords and the mobile device classically requires a male/female physical connection, and usually one where a receptacle is disposed in the mobile device for receiving the male connector. The interface between the receptacle and the male connector requires physical robustness and stability, compatibility of electrical contacts and requisite wear and durability performance. Standards and designs for such male/female connectors have conventionally been defined by standards bodies, or developed by suppliers according to their own standards or designs for mass off-the-shelf availability.

SUMMARY OF THE INVENTION

Various embodiments of the invention relate to input/output architecture structures that can withstand increased forces, bending moments and wear and tear, with minimum risk of structural or electrical connectivity failure, and without deforming or impairing the device in which they are contained. For instance, such cords and plugs may be stepped on, subjected to tension when a user pulls on the cable, or subjected to torque when the cable is pulled while the connector is inserted in the mobile device. More robust architectures that are structured to address such problems can also place additional forces and other requirements on portions of the mobile devices, including the housing, internal structure and circuits in the devices.

Certain embodiments of the invention relate to brackets or trim rings (hereinafter "brackets") which may be interposed between the housing and a connector receptacle in a mobile device to form an input/output architecture. Certain embodiments of brackets according to the present invention provide structural reinforcement of the physical and mechanical connection between the receptacle and the housing. Certain embodiments can provide electrical insulation between the housing and the receptacle. Certain embodiments can impart flexibility in the physical and mechanical connection between the housing and the receptacle in order, for example, to reduce possibility of mechanical deformation of the housing and/or receptacle, or other portions of the device, when a connector imparts undue forces or torque on the receptacle or the input/output architecture.

Accordingly, there is provided a bracket configured to be interposed between the housing of a mobile electronic device and an electrical receptacle that is disposed in the mobile electronic device, the bracket including:
a bracket body, comprising:
a front face;
a back face;
an elongated protrusion extending in a front direction from the front face; and
a pair of fastener accommodations extending from the front face to the back face, each fastener accommodation disposed on opposite sides of the elongated protrusion;
an elongated opening extending through the bracket body;
a sheath surrounding portions of the bracket body, the sheath comprising:
a first portion surrounding a portion of the bracket body elongated protrusion; and
a second portion including a pair of fastener openings, each fastener opening extending through the sheath second portion and disposed in predetermined alignment with one of the fastener accommodations of the bracket body, the fastener openings each configured to receive a fastener whereby the fastener is not in physical contact with the bracket body.

In some embodiments, the body elongated protrusion comprises:
a pair of upper and lower outer surfaces that extend from the front face of the bracket body;
a pair of arcuate outer surfaces, each of which extends from the front face of the bracket body, each of which arcuate surfaces also extends between the upper and lower outer surfaces; and
a front edge extending from the outer surfaces in a plane parallel to the front face of the bracket body.

In some embodiments, the bracket elongated opening comprises:
a pair of upper and lower inner surfaces that correspond to the upper and lower outer surfaces of the bracket body elongated protrusion; and
a pair of arcuate inner surfaces, each of which corresponds to one of the arcuate outer surfaces of the bracket body elongated protrusion.

In some embodiments, the bracket can include a bevel extending between the bracket body front face and the bracket elongated opening inner surfaces, and/or an expanded opening that includes:
a ledge extending from the elongated opening inner surfaces;
a pair of upper and lower inner relief surfaces extending from the ledge and corresponding to the elongated opening upper and lower inner surfaces; and
a pair of arcuate relief surfaces, each of which extends from the ledge and corresponds to one of the elongated opening arcuate inner surfaces.

In some embodiments, the bracket can include a chamfer extending between the bracket body back face and the inner relief surfaces of the expanded opening.

In some embodiments, the upper and lower outer surfaces and the upper and lower inner surfaces are planar.

In some embodiments, the bracket body is formed of an electrically conductive material and the sheath is formed of electrically insulative material and the fastener openings are each configured to receive a fastener that is not in physical or electrical contact with the bracket body.

In some embodiments, the sheath first portion includes:
a pair of sheath first portion upper and lower outer surfaces that correspond to the bracket body upper and lower outer surfaces;
a pair of sheath first portion arcuate outer surfaces, each of which corresponds to one of the outer arcuate surfaces of the bracket body; and a sheath first portion front edge extending from the sheath first portion upper and lower outer surfaces and arcuate outer surfaces, the sheath first portion front edge disposed flush with the front edge of the elongated protrusion.

In some embodiments, the sheath further comprises:

a sheath second portion front face disposed parallel to the bracket body front face and extending from the sheath first portion;

a sheath second portion back face including an opening that receives portions of the bracket body back face whereby the portions of the bracket body back face are flush with the sheath back face; and a sheath second portion outer edge extending between the sheath second portion front face and the sheath second portion back face.

There is also provided a bracket, comprising
a bracket body, comprising:
a front face;
a back face;
an elongated protrusion extending in a front direction from the front face, the elongated protrusion comprising an outer surface that extends from the front face of the bracket body and a front edge extending from the outer surface in a plane parallel to the front face; and
a pair of fastener accommodations extending from the front face to the back face, each fastener accommodation disposed on opposite sides of the elongated protrusion;
an opening extending through the bracket body; and
a sheath surrounding portions of the bracket body, comprising:
  a first portion surrounding a portion of the bracket body elongated protrusion, the first portion including a sheath first portion outer surface that corresponds to the bracket body protrusion outer surface; and a sheath first portion front edge extending from the sheath first portion outer surface; and
  a second portion including a sheath second portion front face and a sheath second portion back face, and a pair of fastener openings, each extending between the sheath second portion front face and the sheath second portion back face and disposed in predetermined alignment with one of the fastener accommodations of the bracket body, the fastener openings each configured to receive a fastener that is not in physical contact with the bracket body.

In some embodiments, the sheath first portion front edge is disposed flush with the front edge of the elongated protrusion.

In some embodiments, the sheath is formed of electrically insulative material and the fastener openings are each configured to receive a fastener whereby the fastener is not in electrical contact with the bracket body.

There is also provided a bracket configured to be interposed between the housing of a mobile electronic device and an electrical receptacle that is disposed in the mobile electronic device, the bracket including:
a bracket body, comprising:
a front face;
a back face;
an elongated protrusion extending in a front direction from the front face, the elongated protrusion comprising:
  an upper outer planar surface that extends from the front face of the bracket body;
  a lower outer planar surface that extends from the front face of the bracket body;
  a pair of arcuate outer surfaces, each of which extends from the front face of the bracket body, each of which arcuate surfaces extends between the upper outer surface and the lower outer surface;
  a front edge extending from the upper outer planar surface, lower outer planar surface and arcuate outer surfaces in a plane parallel to the front face; and
a pair of fastener accommodations extending from the front face to the back face, each fastener accommodation disposed on opposite sides of the elongated protrusion;
an opening extending through the bracket body, the opening including:
  an upper inner planar surface that extends parallel to the upper outer planar surface of the elongated protrusion;
  a lower inner planar surface that extends parallel to the lower outer planar surface of the elongated protrusion;
  a pair of arcuate inner surfaces, each of which extends in a direction concentric with one of the arcuate outer surfaces of the elongated protrusion;
  an upper bevel surface extending between the face of the elongated protrusion and the upper inner planar surface of the opening;
  a lower bevel surface extending between the front edge of the elongated protrusion and the lower inner planar surface of the opening;
  a pair of arcuate bevel surfaces, each of which extends between the front edge of the elongated protrusion and one of the arcuate inner surfaces of the opening;
  a ledge extending from the upper inner planar surface, the lower inner planar surface, and the pair of arcuate inner surfaces of the opening in a direction parallel to the front face of the bracket body;
  an upper inner planar relief surface extending from the ledge in a direction parallel to the upper inner planar surface;
  a lower inner planar relief surface extending from the ledge in a direction parallel to the lower inner planar surface;
  a pair of arcuate relief surfaces, each of which extends from the ledge in a direction concentric with one of the arcuate inner surfaces;
  a chamfer extending between the back face and the upper inner planar relief surface, the lower inner planar relief surface, and arcuate relief surfaces; and
a sheath formed of electrically insulative material surrounding portions of the bracket body, comprising:
  a first portion surrounding the bracket body elongated protrusion, the first portion including:
    a sheath first portion upper outer planar surface that is disposed parallel to the upper outer planar surface of the bracket body;
    a sheath first portion lower outer planar surface that is disposed parallel to the lower outer planar surface of the bracket body;
    a sheath first portion pair of arcuate outer surfaces, each of which extends in a direction concentric with one of the outer arcuate surfaces of the bracket body;
    a sheath first portion front edge extending from the sheath first portion upper outer planar surface, the sheath first portion lower outer planar surface and the sheath first portion arcuate outer surfaces disposed in a plane parallel to the front face;
    the sheath first portion front edge disposed flush with the front edge of the bracket body elongated protrusion; and
  a second portion including:
    a sheath second portion front face disposed parallel to the bracket front face and extending from the sheath first portion;

a sheath second portion back face including an opening that receives a portion of the back face of the bracket body whereby the portion of the back face of the bracket body is disposed flush with the sheath back face;

a sheath second portion outer edge extending between the sheath second portion front face and the sheath second portion back face; and a pair of fastener openings, each extending between the sheath second portion front face and the sheath second portion back face and disposed in predetermined alignment with one of the fastener accommodations of the bracket body, the fastener openings each configured to receive a fastener whereby the fastener is not in electrical or physical contact with the bracket body.

In some embodiments, the bracket body front edge and sheath first portion front edge are configured to be flush with an outer surface of the housing.

In some embodiments, the fastener openings of the sheath are not threaded.

In some embodiments, the fastener openings of the sheath are threaded.

In some embodiments, the fastener openings of the sheath and the accommodations of the bracket body are configured to provide mechanical flexibility that permits movement of the bracket body relative to fasteners inserted in the fastener openings.

In some embodiments, the accommodations are C-shaped.

BRIEF DESCRIPTION OF THE DRAWINGS

FIG. 5 is a cross sectional view of the bracket of FIG. 1A and FIG. 1B, taken through section 5-5 of FIG. 1A.

DETAILED DESCRIPTION

Figure 1A:
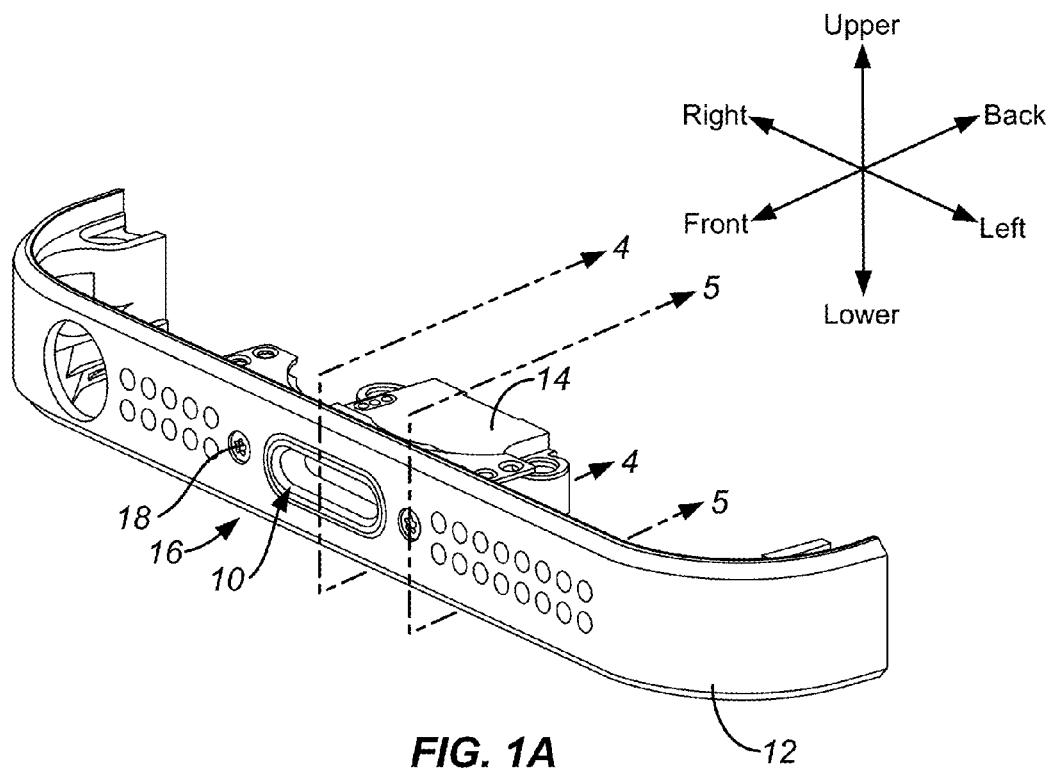
FIG. 1A is a perspective view of a bracket according to one embodiment of the present invention interposed between a housing of a mobile device and a receptacle.

FIG. 1A is a perspective view of a bracket 10 according to a first embodiment of the invention. Bracket 10 is shown mechanically interposed between a mobile device housing 12 and a receptacle 14. Housing 12 may be a housing for a mobile telephone, music/media player, SMART phone, or other mobile or small device. Brackets 10 may also be configured for use in non-mobile devices. Receptacle 14 provides, among other things, electrical connectivity using pins, leads or similar structure for providing input and output of electrical power and/or data to the mobile device. Together, the bracket 10 and receptacle 14, in combination with the portion of the housing 12 in which bracket 10 is received, are referred to as "input/output architecture" 16.

For purposes of description of the embodiment of the invention shown in FIGS. 1-5, a three-dimensional set of orthogonal axes is shown relative to the input/output architecture 16 of FIG. 1A. The axes set is labeled relative to the direction in which the bracket 10 extends through the housing 12 as the front direction, and the opposite direction as the back direction to form a front-back axis. Orthogonal to the front direction, a right direction and a left direction are shown and form a left-right axis. Again, orthogonal to the front-back and left-right axes, an upper direction and lower direction are shown which form an upper-lower axis. A frontal plane is defined by the left-right and upper-lower axes. A sagittal plane is defined by the front-back and upper-lower axes. A superior plane is defined by the left-right and front-back axes. Accordingly, it is apparent that the particular bracket 10 shown in FIG. 1A and FIG. 1B is symmetrical in a sagittal plane through a centerline through the center of the elongated opening (which opening is described below) in the sagittal plane, though asymmetrical in a frontal plane or a superior plane through that center. Brackets according to various embodiments of the invention may be symmetrical or asymmetrical in various planes as desired.

Figure 1B:
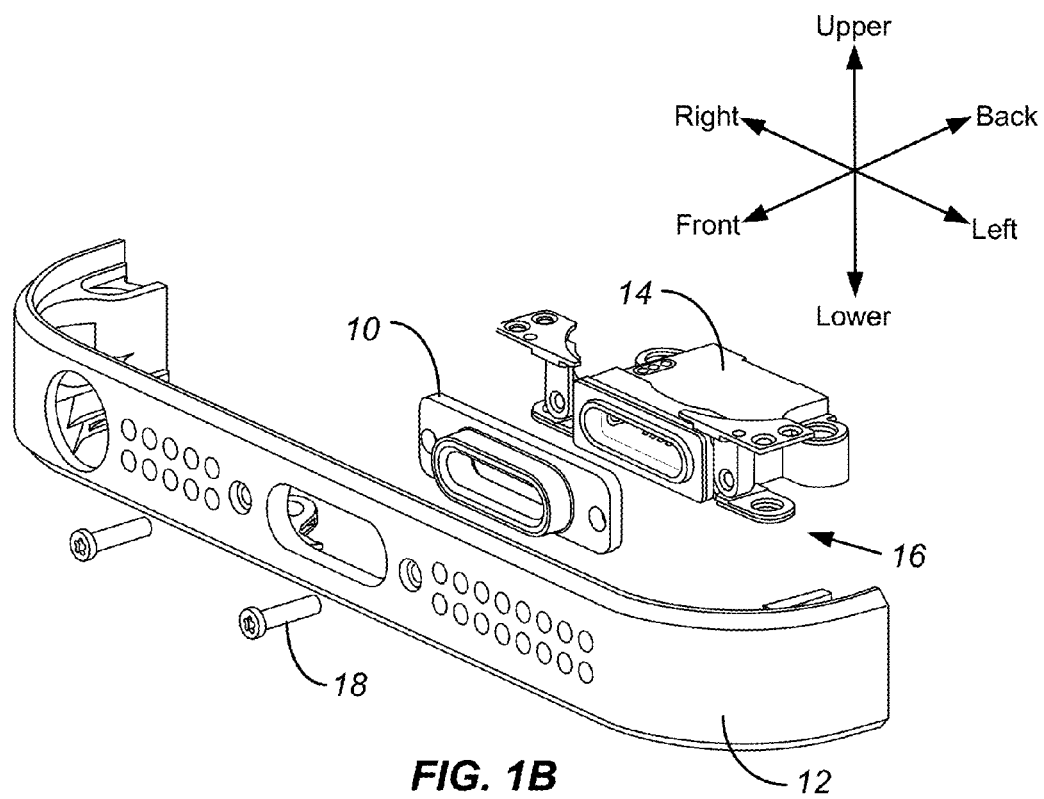
FIG. 1B is an exploded perspective view of the bracket of FIG. 1A interposed between a housing of a mobile device and a receptacle.

FIG. 1B shows an exploded view of bracket 10, receptacle 14 and housing 12, and thus an exploded view of input/output architecture 16 of FIG. 1.

Figure 2A:
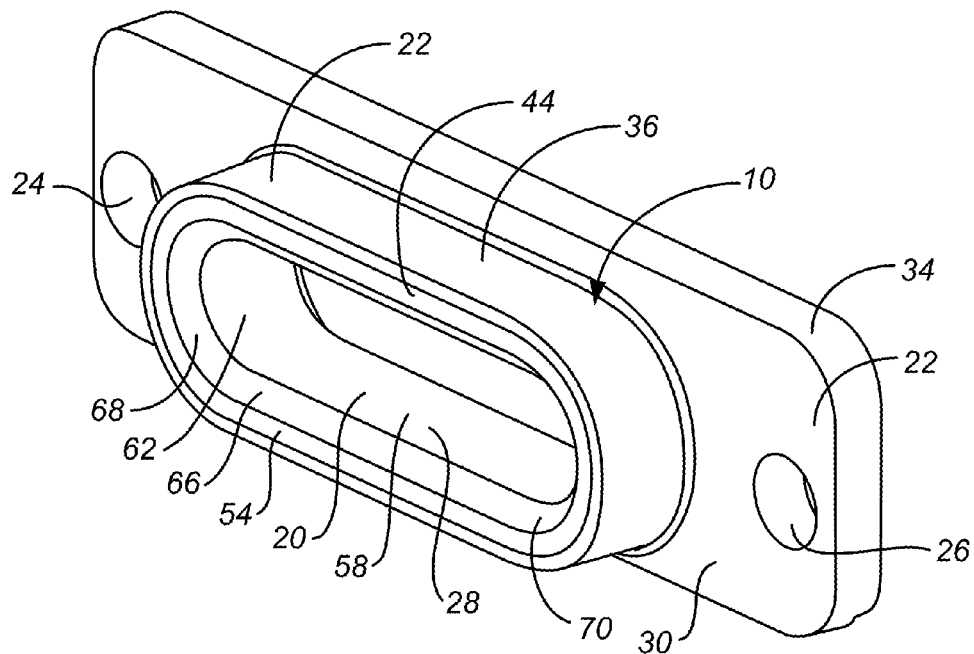
FIG. 2A is a front perspective view of the bracket of FIGS. 1A and 1B.
Figure 2B:
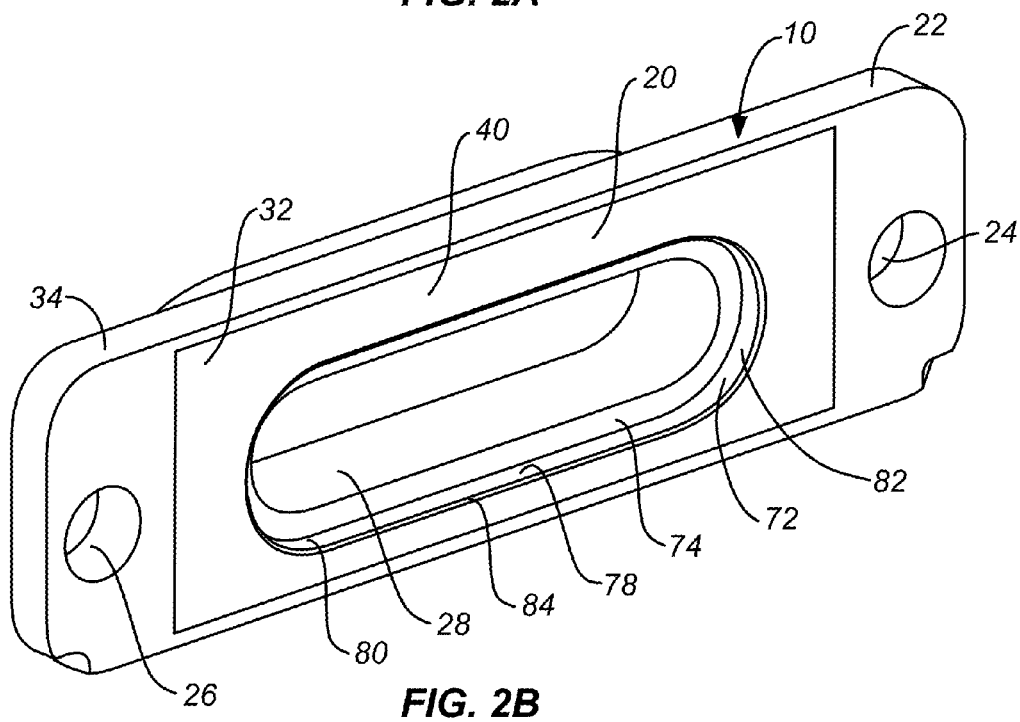
FIG. 2B is a back perspective view of the bracket of FIGS. 1A and 1B.

FIG. 2A and FIG. 2B show, in front and back perspective, respectively, the bracket 10 of FIG. 1A and FIG. 1B. As shown in FIGS. 2A and 2B, bracket 10 includes a bracket body 20 and a sheath 22 that surrounds portions of the bracket body 20. Bracket body 20 may be formed of metal or any other desired material that has requisite stiffness and strength properties. Preferably bracket body 20 is electrically conductive. Bracket body 20 may be cast, machined, stamped or formed as otherwise desired. Sheath 22 that surrounds portions of bracket body 20 may be formed of any desirable plastic or other material that is preferably electrically insulative; such material also may feature resilience or deformability characteristics as desired in order to add mechanical flexibility to input/output architecture 16. Sheath 22 may be over-molded or otherwise formed on bracket body 20 in conventional fashion or as otherwise desired.

Bracket 10 as shown in FIGS. 2A and 2B includes two fastener openings, a right fastener opening 24 and a left fastener opening 26, that extend in a front-back direction through sheath 22. As can be seen in FIGS. 2A and 2B, the fastener openings 24, 26 extend only through the sheath 22 and do not intersect the bracket body 20, so that fasteners 18 (see FIGS. 1A and 1B) extending through them are not in electrical contact with bracket body 20. Bracket 10 also includes an elongated opening 28 that extends in a front-back direction through bracket 10 (the elongated direction of opening 28 is right-left). Bracket 10 as shown in FIGS. 2A and 2B also includes a front face 30 and a back face 32. A bracket edge face 34 extends between the bracket front face 30 and the bracket back face 32. An elongated protrusion 36 extends in the front direction from the bracket front face 30.

Figure 3A:
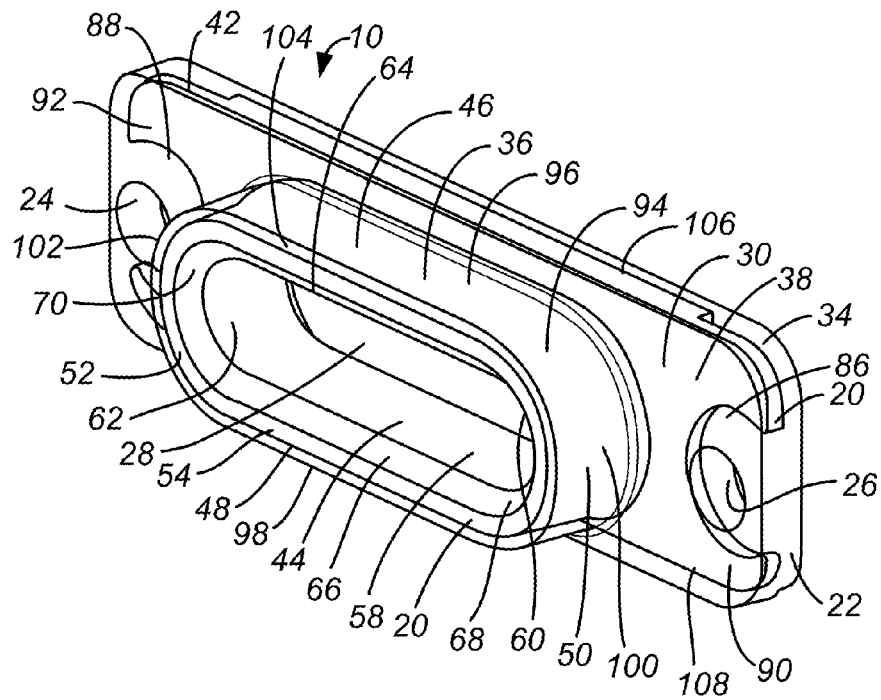
FIG. 3A is a partially transparent view that corresponds to FIG. 2A.
Figure 3B:
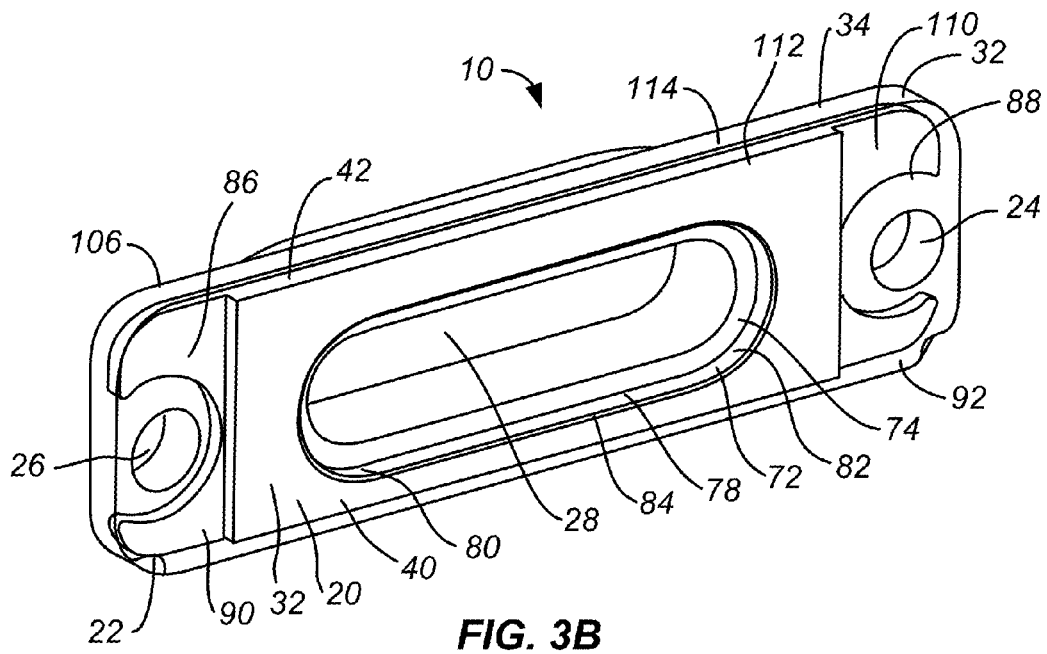
FIG. 3B is a partially transparent view that corresponds to FIG. 2B.

FIGS. 3A and 3B show the structures of FIGS. 2A and 2B in partially transparent views. These figures make evident that bracket body 20 includes a bracket body front face 38 that corresponds to and is parallel to bracket front face 30; a bracket body back face 40 that corresponds to and is parallel to bracket back face 32, a bracket body edge face 42 that corresponds to bracket edge face 34, and a bracket body elongated protrusion 44 that corresponds to bracket elongated protrusion 36. As shown in FIGS. 3A and 3B, bracket body elongated protrusion 44 includes an upper outer planar surface 46, a lower outer planar surface 48 and a pair of arcuate outer surfaces 50, 52, all of which extend from bracket body front face 38 in the front direction to form the exterior of bracket body elongated protrusion 44. Extending in turn from surfaces 46, 48, 50 and 52 is a bracket body front edge 54 that is located in the frontal plane (and thus parallel to bracket body front face 38) and configured to be flush with the exterior of housing 12 when bracket 10 is installed in the mobile device.

Extending through bracket body 20 and thus through bracket 10 is elongated opening 28. Elongated opening 28 includes an upper inner planar surface 56 that extends parallel to the bracket body upper outer planar surface 46; a bracket body lower inner planar surface 58 that extends parallel to the bracket body lower outer planar surface 48, and a pair of arcuate inner surfaces 60, 62, each of which is concentric with one of the arcuate outer surfaces 50, 52. The elongated opening 28 intersection with bracket body front face 38 may be beveled: In the bracket body 20 shown in FIGS. 3A and 3B, bracket body front edge 54 is connected to bracket body upper inner planar surface 56 via upper bevel surface 64 that extends between bracket body front edge 54 and bracket body upper inner planar surface 56. Similarly, a lower bevel surface 66 extends between front edge 54 and lower inner planar surface 58, and a pair of arcuate bevel surfaces 68, 70 extends between front edge 54 and arcuate inner surfaces 60, 62 of bracket body 20. Bevel surfaces 64, 66, 68 and 70 may be dimensioned and otherwise formed in bracket body 20 to allow bracket 10 to accommodate connectors more easily, and to avoid sharp edges that might otherwise be presented to the user, among other purposes.

As shown in FIG. 3B, with respect to the back of bracket 10, opening 28 toward the back direction opens on to a relief or expanded opening 72 whose shape in the frontal plane corresponds to the shape of opening 28. Expanded opening 72 may, among other things, receive or otherwise accommodate portions of receptacle 14. A ledge 74 extends from the upper inner plane surface 56, lower inner planar surface 58 and arcuate inner surfaces 60, 62 of opening 28 in a plane that is parallel to bracket body back face 40. From ledge 74 extends an upper inner planar relief surface 76 that is parallel to the bracket body upper inner planar surface 56. Likewise, a lower inner planar relief surface 78 extends from the ledge 74 in a direction parallel to bracket body lower inner planar surface 58, and a pair of arcuate relief surfaces 80, 82 extend from the ledge in a direction that is concentric with one of the arcuate inner surfaces 60, 62.

As further shown in FIG. 3B, a chamfer 84 extends between the back face 40 of bracket body 20 and relief surfaces 76, 78, 80 and 82. Chamfer 84 may be formed as desired to round edges and otherwise finish the bracket body 20.

As shown in FIG. 3A, bracket body 20 also includes a left fastener accommodation 86 and a right fastener accommodation 88. These accommodations 86, 88 are formed in bracket body 20 to allow penetration by fasteners 18 through fastener openings 24, 26 in sheath 22 (which is electrically insulative) without physical or electrical contact between the fasteners 18 and bracket body 20. Accommodations 86, 88 may also be dimensioned to provide sufficient distance and material between fastener openings 24, 26, on the one hand, and bracket body 20 on the other hand, to take advantage of resilient properties of the material of which sheath 22 is formed to allow bracket 10 to provide any desired degree of mechanical flexibility to input/output architecture 16 as the connector 18 encounters physical force or torque. In the embodiment shown in FIGS. 3A and 3B, accommodations 86, 88 are C-shaped, having a center of rotation that aligns generally with the center of rotation of fastener openings 24, 26, but of larger circumference. Additionally, accommodations 86, 88 open onto bracket body edge face 42 to provide the C-shape.

As shown in FIG. 3B, bracket body 20 is thinner in the front-back dimension in the vicinity of the accommodations 86, 88. The thinner portions of bracket body 20 form a left wing and right wing 90, 92 which are covered by portions of sheath 22.

FIGS. 3A and 3B also illustrate the dimensional and physical relationship of sheath 22 to bracket body 20 in the embodiment of bracket 10 shown in those figures. There, sheath 22 includes a first portion 94 that generally surrounds portions of bracket body elongated protrusion 44. Sheath first portion 94 accordingly includes a sheath first portion upper outer planar surface 96 that is disposed parallel to the bracket body upper outer planar surface 46. Similarly, sheath first portion 94 includes a sheath first portion lower outer planar surface 98 that corresponds to bracket body lower outer planar surface 48, and includes sheath first portion arcuate outer surfaces 100, 102, each of which extends in a direction that is concentric with one of the bracket body arcuate outer surfaces 50, 52. Extending orthogonally from outer surfaces 96, 98, 100 and 102 is a sheath first portion front edge 104 that is disposed in a plane that is parallel to front face 38 of bracket body 20. Sheath first portion front edge 104 is preferably disposed on sheath 22 relative to bracket body front edge 54 to be coplanar to bracket body front edge 54 and also flush with the outer surface of housing 12 of the mobile device when the bracket 10 is installed in the mobile device. Sheath first portion 94 also includes inner surface 105 that corresponds to outer surfaces 96, 98, 100 and 102, which inner surface 105 extends from sheath first portion front edge 104 and abuts bracket body elongated protrusion 44 surfaces as a result of formation of sheath 22 on bracket body 20.

A sheath second portion 106 generally surrounds portions of non-elongated bracket body 20 that do not form bracket elongated protrusion 36. As shown in FIGS. 3A and 3B, sheath second portion 106 includes a sheath second portion front face 108 that is disposed parallel to the bracket body front face 38 and that extends from the sheath first portion 94. Similarly, sheath second portion 106 includes a sheath second portion back face 110 that includes an opening 112. Opening 112 receives portions of bracket body back face 40 that do not correspond to left or right wings 90, 92 of bracket body 20. Accordingly, the non-wing portions of the back face 40 of bracket body are flush with sheath second portion back face 110 when the sheath 22 is formed. Additionally, sheath second portion 106 includes a sheath second portion outer edge 114 that extends between the sheath second portion front face 108 and the sheath second portion back face 110.

As alluded to above, a pair of fastener openings 24, 26 extends between the sheath second portion front face 108 and the sheath second portion back face 110 in a front-back direction. Each fastener opening 24, 26 is disposed in predetermined alignment with one of the fastener accommodations 86, 88 of bracket body 20, and each fastener opening 24, 26 is configured to receive a fastener 18 such that the fastener 18 is not in electrical or physical contact with the bracket body 20. Rather, because the dimensions and positioning of the fastener openings 26, 28 relative to the accommodations 86, 88 do not allow physical contact of the fasteners with the bracket body, but rather interpose material of the sheath 22 between the fastener openings 24, 26 and accommodations 86, 88, there is no electrical contact between fasteners and the bracket body 20. Such interposed material of sheath 22 can also lend mechanical flexibility to the input/output architecture 16 to accommodate predetermined forces and torque on that architecture 16 as may be imposed by or transmitted through a fastener 18 that is inserted or being inserted into the input/output architecture 16.

Figure 4:
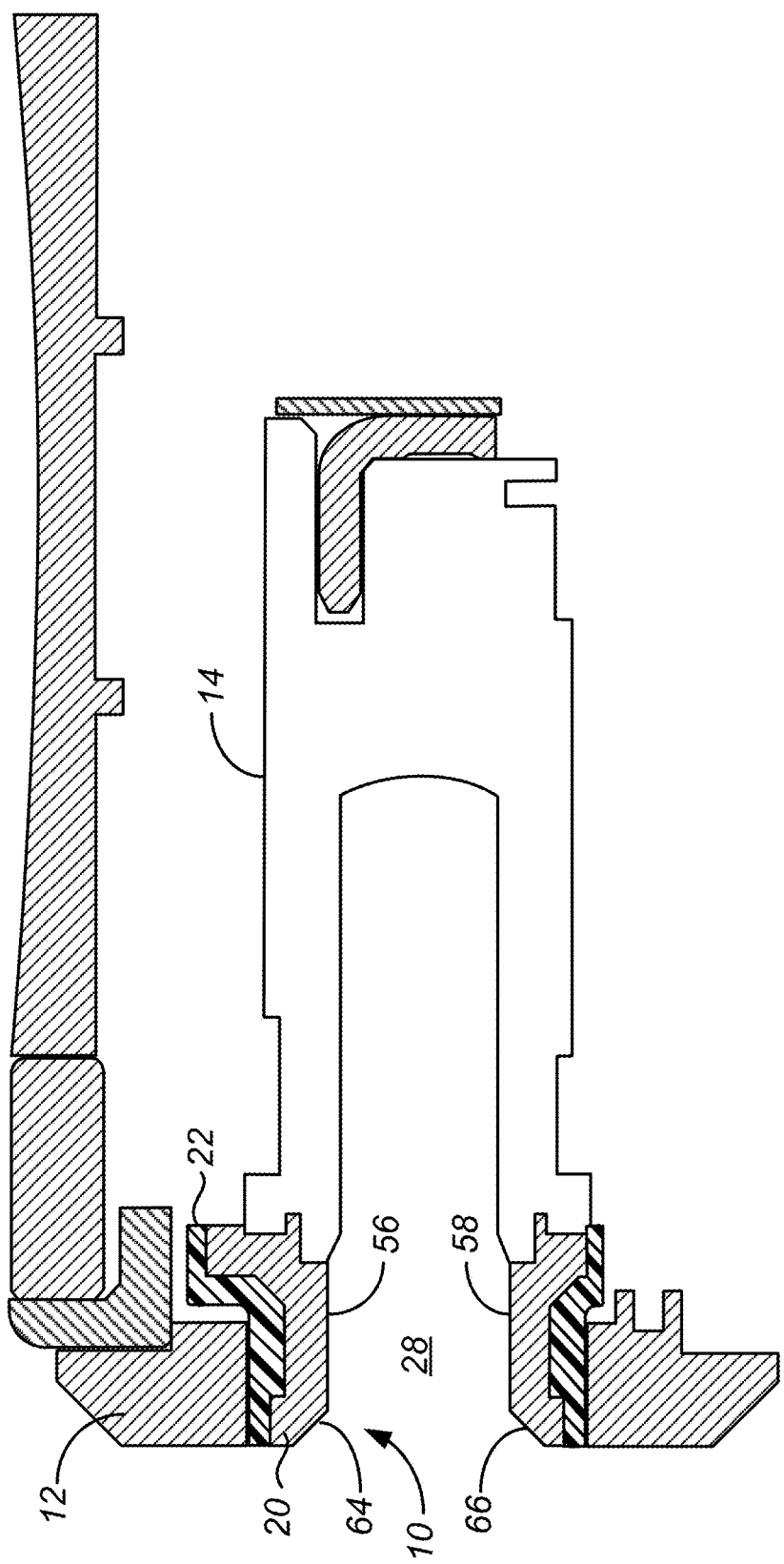
FIG. 4 is a cross sectional view of the bracket of FIG. 1A and FIG. 1B, taken through section 4-4 of FIG. 1A.

FIG. 4 is a side cross sectional view of portions of the input/output architecture 16 shown in FIG. 1A taken through section 4-4 of FIG. 1A. As this figure makes evident, portions of sheath 22 are received in and abut an opening in housing 12 and in turn surround and support bracket body 20; in this view and preferably, the outer face of the housing 12, sheath first portion front edge 104, and bracket body front edge 54 are preferably flush. The receptacle 14 is mechanically connected to the bracket 10.

FIG. 5 is a side cross sectional view of portions of the input/output architecture 16 shown in FIG. 1A taken through section 5-5 of FIG. 1A. FIG. 5 shows a fastener 18 extending through housing 12, sheath 22 of bracket 10 and captured in receptacle 14. As shown in FIG. 5, fastener 18 is not in physical or electrical contact with bracket body 20, due to material of sheath 22 being interposed between fastener 18 and bracket body 20.

Figure 6A:
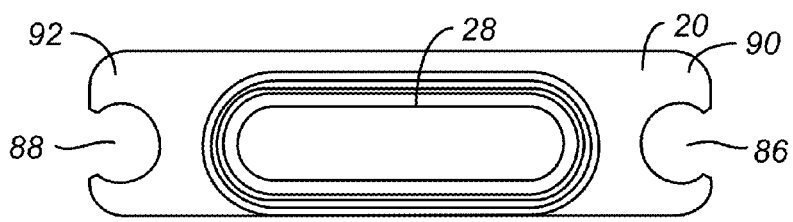
FIGS. 6A-6E are plan views of various embodiments of bracket bodies of brackets according to various embodiments of the invention.
Figure 6B:
Figure 6C:
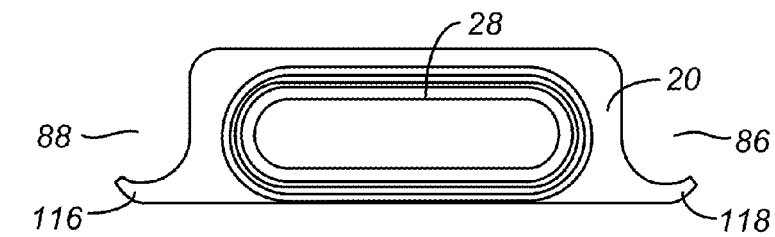
Figure 6D:
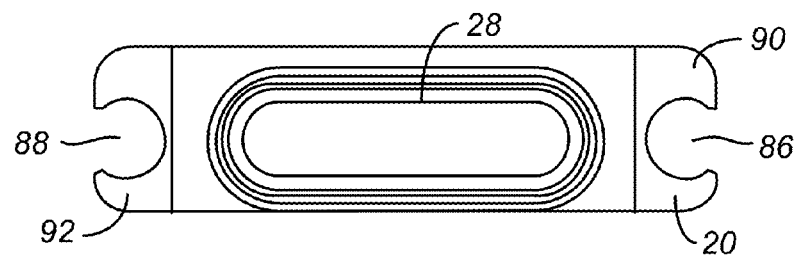
Figure 6E:
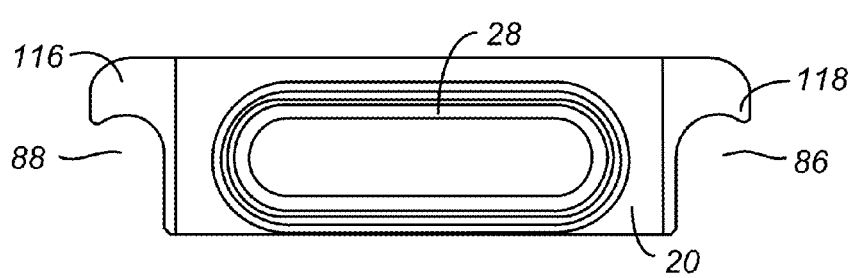

FIGS. 6A-6E show various sizes and shapes of fastener accommodations 86, 88. FIG. 6A shows C-shaped fastener accommodations formed in bracket body 20 in which the distance between bracket body front face 38 and bracket body back face 40 remains constant. FIG. 6B shows similar C-shaped accommodations 86, 88, but a thinner left wing and right wing 90, 92 of bracket body 20. FIG. 6C shows accommodations 86, 88, each of which is formed of only one lip 116, 118. FIG. 6D shows a structure similar to that shown in FIG. 6B, but with thinner wings 90, 92. FIG. 6E shows accommodations 86, 88 formed of lips 116, 118 that define upper portions of the accommodations 86, 88.

Figure 6F:
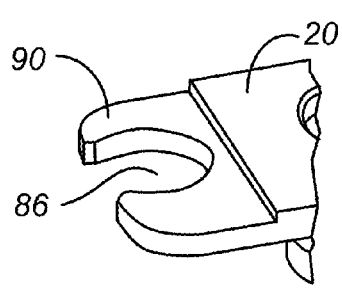
FIGS. 6F and 6G correspond to FIGS. 6B and 6D and show portions of the bracket bodies of FIGS. 6B and 6D.
Figure 6G:
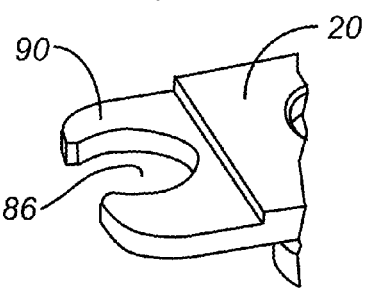

FIG. 6F corresponds to FIG. 6B and shows a thicker wing 90 in the vicinity of accommodation 92. FIG. 6G corresponds to FIG. 6D and shows a thinner wing 90 in the vicinity of accommodation 92.

In the foregoing portions of this document, an embodiment of the invention has been described with reference to numerous specific details that may vary from implementation to implementation. This specification and the accompanying drawings are, accordingly, to be regarded in an illustrative rather than a restrictive sense.

What is claimed is:

1. A bracket configured to be interposed between a housing of a mobile electronic device and an electrical receptacle that is disposed in the mobile electronic device, the bracket comprising:
   an electrically conductive bracket body sized and shaped to be positioned between a receptacle connector housing and an enclosure of an electronic device, the bracket body including: a front face; a back face; a protrusion extending from the front face and an edge that extends between the front face and the back face around an outer perimeter of the bracket body; and
   an electrically insulative sheath surrounding at least portions of the bracket body including the bracket body edge, the sheath including a pair of fastener accommodations extending through the sheath on opposite sides of the protrusion, wherein the fastener accommodations are configured to receive a fastener such that the fastener is not in physical contact with the bracket body.

2. A bracket according to claim 1, wherein the protrusion comprises:
   a pair of upper and lower outer surfaces that extend from the front face;
   a pair of arcuate outer surfaces, each of which extends from the front face, each of which arcuate surfaces also extends between the upper and lower outer surfaces; and
   a front edge extending from the outer surfaces in a plane parallel to the front face of the bracket body.

3. A bracket according to claim 2, further comprising:
   an opening extending from a distal end of the protrusion to the back face, wherein the opening comprises:
   a pair of upper and lower inner surfaces that correspond to the upper and lower outer surfaces of the protrusion; and
   a pair of arcuate inner surfaces, each of which corresponds to one of the arcuate outer surfaces of the protrusion.

4. A bracket according to claim 3 further comprising a bevel extending between the front face and the third opening inner surfaces.

5. A bracket according to claim 3 further comprising an expanded opening, the expanded opening comprising:
   a ledge extending from the third opening inner surfaces;
   a pair of upper and lower inner relief surfaces extending from the ledge and corresponding to the third opening upper and lower inner surfaces; and
   a pair of arcuate relief surfaces, each of which extends from the ledge and corresponds to one of the opening arcuate inner surfaces.

6. A bracket according to claim 5 further comprising a chamfer extending between the back face and the inner relief surfaces of the expanded opening.

7. A bracket according to claim 3 wherein the upper and lower outer surfaces of the protrusion and the upper and lower inner surfaces of the opening are planar.

8. A bracket according to claim 3 wherein the upper and lower outer surfaces of the protrusion and the upper and lower inner surfaces of the opening are not planar.

9. A bracket configured to be interposed between a housing of a mobile electronic device and an electrical receptacle that is disposed in the mobile electronic device, the bracket including:
   an electrically conductive bracket body comprising: a front face, a back face, a protrusion extending from the front face, first and second openings extending from the front face to the back face, and a third opening extending through the bracket body; and
   an electrically insulative sheath surrounding at least portions of the bracket body, the sheath comprising: a first portion surrounding a portion of the protrusion, and a second portion including fourth and fifth openings that extend through the second portion, wherein each of the fourth and fifth openings are concentric with one of the first and second openings and configured to receive a fastener such that the fastener is not in physical contact with the bracket body.

10. A bracket according to claim 9 wherein the fourth and fifth openings of the sheath are threaded.

11. A bracket according to claim 9 wherein the fourth and fifth openings of the sheath and the first and second openings of the bracket body are configured to provide mechanical flexibility that permits movement of the bracket body relative to fasteners inserted in the fourth and fifth openings.

12. A bracket according to claim 9, wherein the protrusion comprises:
   a pair of upper and lower outer surfaces that extend from the front face of the bracket body;
   a pair of arcuate outer surfaces, each of which extends from the front face the bracket body, each of which arcuate surfaces also extends between the upper and lower outer surfaces; and a front edge extending from the outer surfaces in a plane parallel to the front face of the bracket body.

13. A bracket according to claim 12, wherein the sheath first portion includes:
- a pair of sheath first portion upper and lower outer surfaces that correspond to the bracket body upper and lower outer surfaces;
- a pair of sheath first portion arcuate outer surfaces, each of which corresponds to one of the arcuate outer-surfaces of the bracket body; and
- a sheath first portion front edge extending from the sheath first portion upper and lower outer surfaces and arcuate outer surfaces, the sheath first portion front edge disposed flush with the front edge of the protrusion.

14. A bracket according to claim 13 wherein the sheath second portion further includes:
- a sheath second portion front face disposed parallel to the bracket body front face and extending from the sheath first portion;
- a sheath second portion back face including an opening that receives portions of the bracket body back face whereby the portions of the bracket body back face are flush with the sheath back face; and
- a sheath second portion outer edge extending between the sheath second portion front face and the sheath second portion back face.

15. A bracket according to claim 13 wherein the bracket body front edge and sheath first portion front edge are configured to be flush with an outer surface of the housing.

\* \* \* \* \*